United States Patent [19]

Asahina

[11] Patent Number: 4,985,746

[45] Date of Patent: Jan. 15, 1991

[54] SEMICONDUCTOR DEVICE AND METHOD OF PRODUCTION

[75] Inventor: Michio Asahina, Suwa, Japan

[73] Assignee: Seiko Epson Corporation, Tokyo, Japan

[21] Appl. No.: 75,245

[22] Filed: Jul. 16, 1987

Related U.S. Application Data

[63] Continuation of Ser. No. 807,408, Dec. 10, 1985, abandoned.

[30] Foreign Application Priority Data

Dec. 11, 1984 [JP] Japan ................................ 59-261251

[51] Int. Cl.⁵ ............................................. H01L 23/48
[52] U.S. Cl. ...................................... 357/67; 357/23.9; 357/42; 357/59
[58] Field of Search .................. 357/23.9, 42, 59, 67 S

[56] References Cited

U.S. PATENT DOCUMENTS

| | | | |
|---|---|---|---|
| 4,333,099 | 6/1982 | Tanguay et al. | 357/59 I |
| 4,476,482 | 10/1984 | Scott et al. | 357/59 I |
| 4,477,310 | 10/1984 | Park | 357/42 |

Primary Examiner—Edward J. Wojciechowicz
Attorney, Agent, or Firm—Blum Kaplan

[57] ABSTRACT

A novel semiconductor device and method of production of such a device are provided. Both the N and P channels of the novel semiconductor device are formed by contact self-alignment, thereby permitting high speed operation and high density integration to be realized. The formation of the channels by contact self-alignment is accomplished by depositing a P type polysilicon layer on an N well region and an N type polysilicon layer on a P well region. A silicide layer if formed over both the P and N type polysilicon layers to form a polycide.

12 Claims, 3 Drawing Sheets

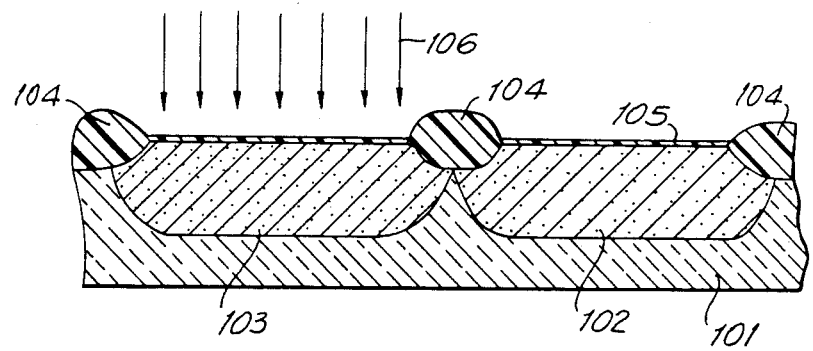
FIG. IA
PRIOR ART
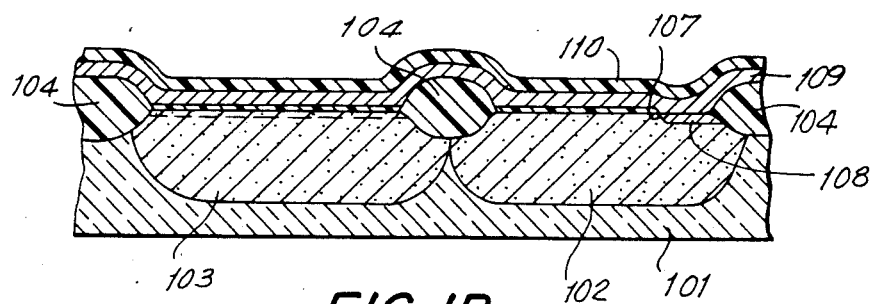
FIG. IB
PRIOR ART
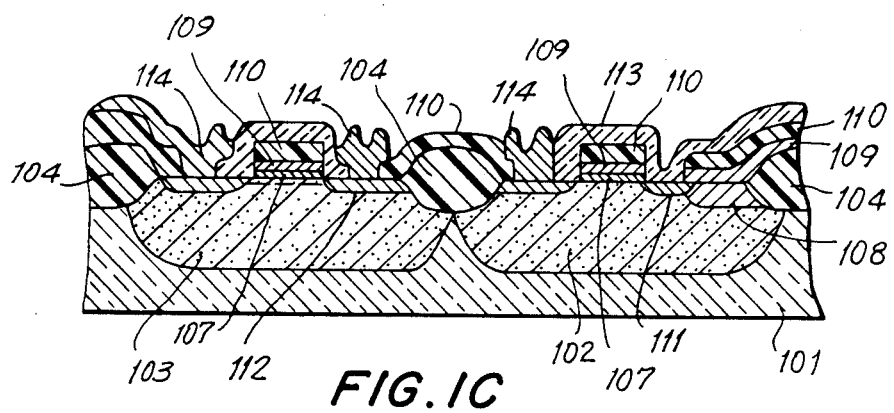
FIG. IC
PRIOR ART

SEMICONDUCTOR DEVICE AND METHOD OF PRODUCTION

This is a continuation of application Ser. No. 06,807,408, filed Dec. 10, 1985, now abandoned.

BACKGROUND OF THE INVENTION

The invention relates to semiconductor devices and, in particular, to semiconductor devices in which short channel effects are minimized.

Recently, techniques for lowering the resistance of gate, source and drain regions have been necessary for the high speed operation of very large scale integration (VLSI) devices. Polycide structures for use as gate portions and salicide structures for lowering the resistance of the gate, source and drain regions have been developed. However, in general, polysilicon beneath silicide is of the N+ type only and connection with the substrate is accomplished only on the N channel side.

Since the polycide consists of two layers, even though polysilicon beneath silicide is provided on both P and N channel regions having different polarities, the P and N channels are connected at the upper silicide. Furthermore, when the P and N channels are simultaneously formed by contact self-alignment, it is possible to connect the drain regions of the P and N channels to adjacent transistors. It, therefore, becomes possible to lower the resistance of the gate, source and drain of the P and N channels and the process of connecting the regions, that is, providing aluminum on the contact portion of the polysilicon between the different polarities of the P and N channel regions, is reduced.

In order to reduce resistor/capacitor, RC delay in gate wiring, conventional N+ polysilicon gate materials have been replaced by silicide, polycide and refractory metals. In conventional polycide gates, the P channel is not formed by contact self-alignment because the polysilicon contains N type impurities. It has been necessary to inject boron ions, B+, into the P channel in order to decrease the differences in work function between the P and N channels and regulate threshold voltage. However, injection of boron ions causes punch through voltage to fall.

It is, therefore, desirable to provide a novel semiconductor device in which both the P and N channels are formed by contact self-alignment and which overcomes the defects of prior art semiconductor devices.

SUMMARY OF THE INVENTION

Generally speaking, in accordance with the invention a novel semiconductor device and method of making such a device are provided. Both the N and P channels of the novel semiconductor device are formed by contact self-alignment, thereby permitting high speed operation and high density integration to be realized.

Accordingly, it is an object of the invention to provide an improved semiconductor device and method of fabrication.

It is another object of the present invention to provide a semiconductor device wherein the P and N channels are formed by contact self-alignment.

It is a further object of the invention to provide a method for making the semiconductor device including forming both the N and P channels by contact self-alignment.

Still other objects and advantages of the invention will in part be obvious and will in part be apparent from the specification.

The invention accordingly comprises the several steps and the relation of one or more such steps with respect to each of the others, and the article possessing the features, properties and the relation of elements, which are exemplified in the following detailed disclosure, and the scope of the invention will be indicated in the claims.

DESCRIPTION OF THE DRAWINGS

For a fuller understanding of the invention, reference is had to the following description taken in connection with the accompanying drawings, in which:

FIGS. 1(a)–(c) are cross-sectional views showing the steps in a conventional method for producing a semiconductor device including a conventional polycide gate;

DESCRIPTION OF THE PREFERRED EMBODIMENTS

Figure 2A:
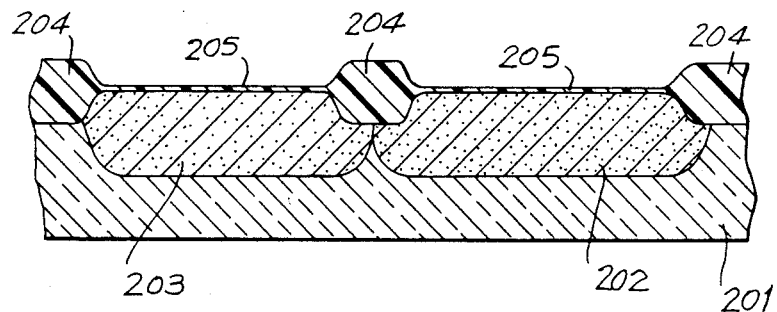
FIGS. 2(a)–(c) are cross-sectional views showing the steps in a method for forming a CMOS integrated circuit including a polycide gate prepared in accordance with the invention.

A semiconductor device and a method for producing such device in which both the P and the N channels are formed by contact self-alignment are provided. This is accomplished by depositing a P type polysilicon layer on an N well region and an N type polysilicon layer on a P well region. A metal disilicon, $MSi_2$ or silicide layer is formed over both the P and N type polysilicon layers to form a polycide.

By providing a P type polysilicon layer over the N well region and an N type polysilicon layer over the P well region, both P and N channels can be formed simultaneously by contact self-alignment. Drain regions of P and N channels of adjacent transistors can be connected. This permits reduction in resistance of the gate, source and drain regions and an increase in the punch through voltage. Furthermore, the method for producing the device is improved, short channel effect is decreased, the variety of pattern designs increases and high integration is realized.

For a better understanding of the semiconductor devices constructed in accordance with the invention, and the methods of construction, reference is made to the following examples. These examples are presented for purposes of illustration only and are not intended to be construed in a limiting sense.

EXAMPLE 1

FIGS. 1(a)–(c) illustrate the steps in a conventional method for producing a conventional polycide gate. In FIG. 1(a), a P well region 102 and an N well region 103 are formed in substrate 101. Boron ions, B+, are injected in low concentration into the N well region as illustrated by arrows 106, in order to regulate the threshold voltage of the P channel region.

FIG. 1(b) shows photoetching of a gate oxide layer 107 necessitated by the formation of the N channel region by contact self-alignment. Subsequently, a polysilicon layer 109 is deposited and N type impurities are thermally diffused resulting in formation of an N plus diffusion region 108 by contact self-alignment. A molybdenum disilicon MoSi$_2$ layer 110 is formed on the polysilicon layer 109 by sputtering.

FIG. 1(c) shows photoetching of the polycide layer formed of silicide layer 110 over polysilicon layer 109. The entire polycide layer is etched with the exception of the portions that are to become gate electrodes and transmission lines from diffusion layer 108. Boron ions B+ are injected into P well region 102 and phosphorus ions P+ are injected into N well region 103. In this manner, source and drain regions 111 and 112, respectively, are formed in each channel. A layer of phosphoric silicate glass (PSG) 113 is deposited across the structure. Then contact holes for connecting the diffusion regions and transmission lines are formed by etching PSG 113. Finally, an aluminum silicon connector 114 is deposited in the contact holes.

In this conventional method, the P channel is not formed by contact self-alignment. The punch through voltage falls as the result of the injection of boron ions into the P channel to regulate the threshold voltage. In order to maintain satisfactory performance it is necessary to make the P channel about 0.5 u longer than the N channel.

EXAMPLE 2

Figure 2B:
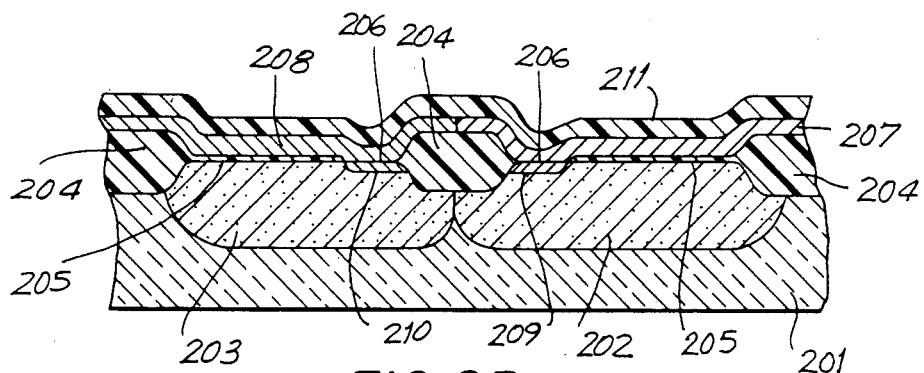
Figure 2C:
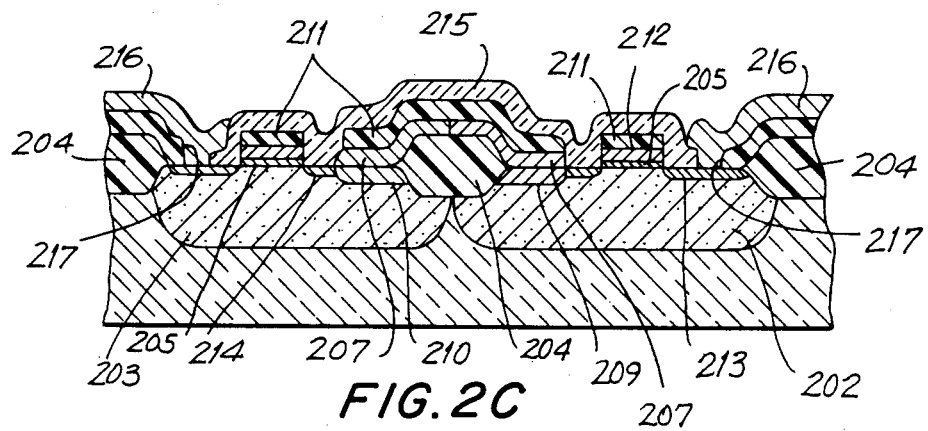

FIGS. 2(a)-(c) shows cross-sectional views of a semiconductor device manufactured in accordance with the process of the invention. Referring to FIG. 2(a), a P well region 202 and an N well region 203 are formed in a substrate 201. Each active region is formed by local oxidation of silicon (Locos) 204. Locos regions 204 are an insulating layer for isolating adjacent elements. A gate insulating film 205 is formed over P well region 202 and N well region 203.

Referring to FIG. 2(b), an N type polysilicon layer 207 is formed on P well region 202 and a P type polysilicon layer 208 is formed on N well region 203. Since both the P and the N channels are formed by contact self-alignment, it is not necessary to inject boron ions, B+, into the P channel for regulating the threshold voltage. Gate insulating film 205 is formed by photoetching. P+ and N+ diffusion regions 210 and 209, respectively, are formed by thermal diffusion utilizing gate oxide layer 205 for contact self-alignment. A tungsten disilicon WSi$_2$ layer 211 is formed on the structure by sputtering.

Referring to FIG. 2(c), WSi$_2$ silicide layer 211 and polysilicon layers 207 and 208 are photoetched except for the portions in the region that are to become gate electrodes and transmission lines from diffusion regions. Arsenic ions As are injected into P well region 202 and boron difluoride BF$_2$ ions are injected into N well region 203 in order to form a source and a drain region 213 and 214, respectively, in each well region. A layer of phosphoric silicate glass (PSG) 215 is deposited across the device and contact holes 217 are formed by etching PSG layer 215. Contact holes are used to connect the diffusion regions and the transmission line. Finally, an aluminum connector 216 is formed to connect to the source or drain regions through contact holes 217.

In accordance with the invention, both the P and N channel regions are formed by contact self-alignment. Furthermore, since the silicide layer is deposited at an upper portion, it is possible to connect the P and N diffusion regions directly to the adjacent transistor through the silicide wiring. Accordingly, the variety of available pattern designs increases, thereby resulting in reduction of the total size of the semiconductor device. Processes of predeposition and ion injection are available for forming the P type or the N type polysilicon layers. Particularly if source and drain regions are formed by diffusion simultaneously with the formation of the N type and P type polysilicon layers, the manufacturing process is improved significantly over manufacturing processes available in the prior art.

EXAMPLE 3

FIG. 3 illustrates an application of the process of the present invention to a salicide, or self-aligned silicide, structure. A P well region 302 and an N well region 303 are formed in a substrate 301. Each active region is formed by local oxidation of silicon with adjacent elements isolated by locos 304. Polysilicon is deposited and a polysilicon gate 306 is formed by photoetching. Using polysilicon gates 306 as a mask, low concentration diffusion layers 307 and 308 are formed in order to prevent the generation of hot electrons. Boron fluoride ions BF$^{+2}$ are injected into N well region 303 at an energy level of 60 KeV to a density of $1 \times 10^{13}$ per square centimeter. Similarly, phosphorus ions P+ are injected into P well region 302 at an energy of 40 KeV to a density of $2 \times 10^{13}$ per square centimeter. Polysilicon P and N channel gates 306 are not doped. P type and N type polysilicon gates 306 could also be formed by diffusion of boron into N well region 303 and phosphorus into P well region 302.

Figure 3A:
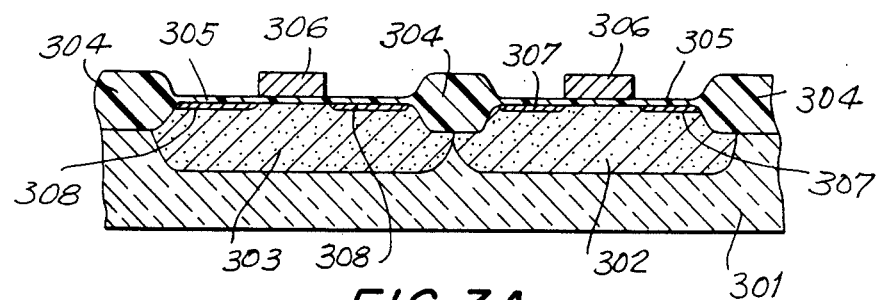
FIGS. 3(a)–(d) are cross-sectional views showing the steps in a method for forming a CMOS integrated circuit using a silicide gate formed in accordance with the invention.
Figure 3B:
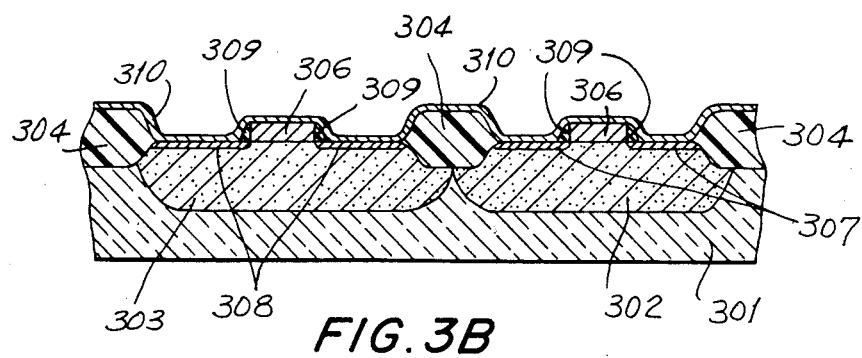

Referring to FIG. 3(b), an SiO$_2$ film having a thickness of 6000 A is deposited on the structure and SiO$_2$ sidewalls 309 are formed on the sides of polysilicon gate 306 by reactive ion etching. A titanium Ti layer 310 having a thickness of 500 A is deposited across the device and a titanium disilicon TiSi$_2$ layer 311 is formed at the exposed silicon regions by lamp annealing at a temperature of between about 600° and 800° C.

Figure 3C:
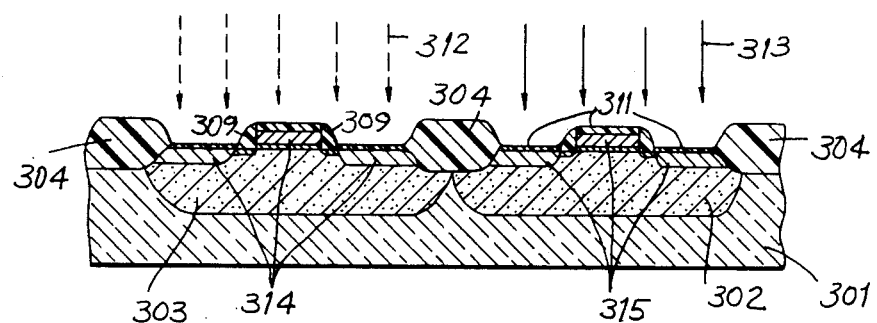

Referring to FIG. 3(c), Ti layer 310 is removed everywhere except the exposed silicon regions by ammonia and water, i.e. NH$_4$OH+H$_2$O+H$_2$O, series etching solution to provide a salicide structure. Boron ions, $^{11}$B+, are injected into N well region 303 at an energy of between about 40 and 120 KeV to a density of $6 \times 10^{15}$ per square centimeter and phosphorus ions, $^{31}$P+, are injected into P well region 302 at an energy of between about 60 and 150 KeV to a density of $8 \times 10^{15}$ per square centimeter.

Figure 3D:
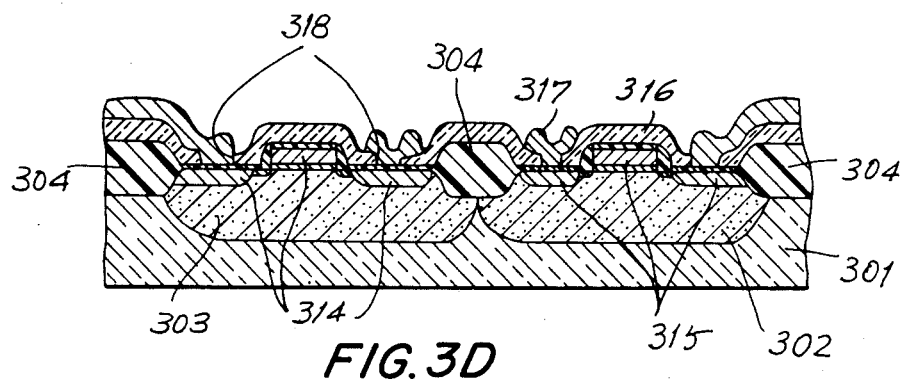

Referring to FIG. 3(d), a phosphoric silicate glass (PSG) film 316 having a thickness of 6000 A is deposited across the device and is annealed with a lamp for approximately 6 seconds at a temperature between about 1000° and 1050° C. in order to activate the ions and form P-N junctions beneath TiSi$_2$ layer 311 at the source and drain regions. Since the gate regions are formed of TiSi$_2$ layer 311 over non-doped SiO$_2$, boron ions, B+, penetrate into TiSi$_2$ layer 311 and are diffused into the non-doped silicon to form the P type polysilicon gate on the side of the P channel regions. Similarly, an N type polysilicon gate is formed over the N channel regions. Contact holes 318 for connecting the diffusion regions and the transmission line is formed by etching PSG layer 316. Finally, an aluminum Al connector 317 is deposited into contact holes 316.

In accordance with this embodiment of the invention, low resistance P and N type gates and a low resistance P-N junction can be formed simultaneously by a single injection of ions into the P and N channel regions. Furthermore, when a contact self-alignment process of the type described in Example 2 is used, P type and N type regions in the self-aligned portion are connected simultaneously and have low resistance. In this manner, the manufacturing process is reduced and high speed operation and high density integration for VLSI devices are realized.

According to the method in accordance with the invention, short channel effect is reduced in both the P and the N channel regions and, simultaneously, the resistance of the source, gate and drain is raised. In this embodiment of the invention, a contact self-alignment process is not employed, although such a process would be practical. Accordingly, a semiconductor device in which P and N channels are formed by contact self-alignment is provided and short channel effect is reduced. Such improvements are not realized in conventional structures using polycide and silicide gates.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor device comprising:
    a substrate of a first conductivity type;
    a well region of a second conductivity type formed in said substrate;
    a first gate insulating film provided on a portion of said well region;
    a first polycrystalline silicon gate of the first conductivity type formed on the first gate insulating film;
    a second gate insulating film provided on a portion of said substrate;
    a second polycrystalline silicon gate of the second conductivity type formed on the second gate insulating film;
    first source and drain regions provided in the well region on either side of the first polycrystalline silicon gate;
    first polycrystalline silicon wiring of the first conductivity type drawn from the first drain region;
    second source and drain regions provided in the substrate on either side of the second polycrystalline silicon gate;
    second polycrystalline silicon wiring of the second conductivity type drawn from the second drain region, said wiring of said first conductive type drawn from the first drain region being directly connected to the wiring of the second conductive type; and
    a metal silicide film formed on substantially the entire surfaces of the polycrystalline silicon wiring and the polycrystalline silicon gates without contacting the source or drain regions.

2. The semiconductor device of claim 1, wherein a well region of a first conductive type is formed in said substrate and wherein said second gate insulating film is formed on said well region of said first conductive type.

3. The semiconductor device of claim 1, wherein the metal silicide film is selected from the group consisting of molybdenum disilicon ($MoSi_2$), tungsten disilicon ($WSi_2$) and titanium disilicon ($TiSi_2$).

4. The semiconductor device of claim 1, wherein the first drain region includes a first drain diffusion region along one side thereof and the second drain region includes a second drain diffusion region along one side thereof and the first drain diffusion region is separated from the second drain diffusion region by an element isolating region.

5. The semiconductor device of claim 4, wherein the first drain diffusion region is the first conductivity type and the second drain diffusion region is the second conductivity type.

6. The semiconductor device of claim 4, wherein the first polycrystalline silicon wiring is directly connected to the second polycrystalline silicon wiring on the surface of the element isolating region.

7. The semiconductor device of claim 4, wherein at least one of the source and drain regions extends under an end of a polycrystalline silicon gate along one side thereof and is in contact with an element isolating region along the opposite side thereof.

8. The semiconductor device of claim 1, further including an insulating material provided as a side wall of each of the gate electrodes.

9. The semiconductor device of claim 1, wherein each of the drain regions includes a low density drain region and a high density drain region and each of the source regions includes a low density source region and a high density source region.

10. The semiconductor device of claim 9, wherein the low density source and drain regions are thin and are adjacent a gate electrode and the high density source and drain regions have a thickness greater than the thickness of the low density regions and are distal from the gate electrode.

11. The semiconductor device of claim 8, wherein each of the drain regions includes a low density drain region and a high density drain region and each of the source regions includes a low density source region and a high density source region.

12. The semiconductor device of claim 11, wherein the low density source and drain regions are provided under the side wall of the gate electrode.

* * * * *